United States Patent
Balaniuk et al.

(10) Patent No.: US 7,363,198 B2
(45) Date of Patent: Apr. 22, 2008

(54) LONG ELEMENTS METHOD FOR SIMULATION OF DEFORMABLE OBJECTS

(75) Inventors: Remis Balaniuk, Sunnyvale, CA (US); Ivan F. Costa, Brasilia - DF (BR); J. Kenneth Salisbury, Jr., Mountain View, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1248 days.

(21) Appl. No.: 10/016,661

(22) Filed: Oct. 29, 2001

(65) Prior Publication Data

US 2003/0088389 A1    May 8, 2003

(51) Int. Cl.
    *G06F 17/10*    (2006.01)
(52) U.S. Cl. .................. 703/2; 703/1; 703/11; 703/22; 716/20
(58) Field of Classification Search .................. 703/2, 703/1, 22; 606/151; 716/20
    See application file for complete search history.

(56) References Cited

U.S. PATENT DOCUMENTS

| | | | | |
|---|---|---|---|---|
| 5,266,021 A * | 11/1993 | Jacobson | ..................... | 425/334 |
| 5,831,623 A * | 11/1998 | Negishi et al. | ............. | 345/424 |
| 5,877,777 A | 3/1999 | Colwell | ....................... | 345/473 |
| 6,007,319 A * | 12/1999 | Jacobson | ..................... | 425/140 |
| 6,054,992 A * | 4/2000 | Gibson | ........................ | 345/424 |
| 6,195,625 B1 * | 2/2001 | Day et al. | ...................... | 703/7 |
| 6,256,599 B1 * | 7/2001 | Tiribuzi | ........................ | 703/2 |
| 6,259,453 B1 * | 7/2001 | Itoh et al. | .................... | 345/423 |
| 6,295,464 B1 | 9/2001 | Metaxas | ...................... | 600/407 |
| 6,714,901 B1 * | 3/2004 | Cotin et al. | ..................... | 703/7 |
| 6,718,289 B1 * | 4/2004 | Suzuki et al. | .................. | 703/2 |
| 6,792,398 B1 * | 9/2004 | Handley et al. | ................ | 703/2 |
| 6,804,635 B1 * | 10/2004 | Dhondt | .......................... | 703/2 |
| 6,941,255 B2 * | 9/2005 | Kennon et al. | ................ | 703/10 |
| 7,024,344 B1 * | 4/2006 | Nishi | ............................ | 703/7 |
| 7,107,159 B2 * | 9/2006 | German | ........................ | 702/41 |

(Continued)

OTHER PUBLICATIONS

"LEM—An approach for real time physically based soft tissue simulation" Ivan F. Costa and Remis Balaniuk, proceeding of the 2001 IEEE, pp. 2337-2343, International Conference on Robotics and Automation, Seoul, Korea, May 21-26, 2001.*

(Continued)

*Primary Examiner*—Hugh Jones
*Assistant Examiner*—Kibrom K. Gebresilassie
(74) *Attorney, Agent, or Firm*—Lumen Patent Firm, Inc.

(57) ABSTRACT

Long Elements Method (LEM) for real time physically based dynamic simulation of deformable objects. The LEM is based on a new meshing strategy using long elements whose forms can be straight or arbitrary. The LEM implements a static solution for elastic global deformations of objects filled with fluid based on the Pascal's principle and volume conservation. The volumes are discretised in long elements, defining meshes one order of magnitude smaller than meshes based on tetrahedral or cubic elements. The LEM further combines static and dynamic approaches to simulate the same deformable medium, allowing modeling a three-dimensional internal state at any point inside the deforming medium from a reduced number of explicitly updated elements. Complex elastic and plastic deformations can be simulated in real time with less computational effort. The LEM is particularly useful in real time virtual interactions, soft tissue modeling, and graphic and haptic rendering.

14 Claims, 9 Drawing Sheets

U.S. PATENT DOCUMENTS

| | | | |
|---|---|---|---|
| 7,149,671 B2* | 12/2006 | Lim et al. .................. | 703/9 |
| 7,191,104 B2* | 3/2007 | Stewart et al. .................. | 703/2 |
| 7,218,774 B2* | 5/2007 | Liu ........................... | 382/154 |
| 7,239,992 B2* | 7/2007 | Ayache et al. ................. | 703/11 |
| 7,275,023 B2* | 9/2007 | Chen et al. .................... | 703/2 |
| 2002/0183992 A1* | 12/2002 | Ayache et al. ................ | 703/2 |
| 2004/0148145 A1* | 7/2004 | Chen et al. .................... | 703/2 |
| 2005/0018885 A1* | 1/2005 | Chen et al. ................. | 382/128 |
| 2006/0262112 A1* | 11/2006 | Shimada .................... | 345/419 |

OTHER PUBLICATIONS

Sarah Gibson, Christina Fyock, . . . ,Volumteric Object Modeling for Surigcal Simulation, Nov. 5, 1997,MIT,pp. 1-20.*

Xunlei Wu. Michael Downes, Tolga Goktekin, and Frank Tendick, Adaptive Nonlinear Finite elements for Deformable Body Simulation Using Dynamic Progressive Meshes, Eurographics 2001, pp. 1-10, vol. 20, No. 3.*

Preliminary Finite Element Analysis with SAGE, herein referred as PFEAS, 2000, pp. 318-338 and extra page showing the creation of the PDF.☐☐ ☐☐.*

Sarah Gibson, Christina Fyock, . . . ,Volumteric Object Modeling for Surigcal Simulation,s Nov. 1997,MIT,pp. 1-20.☐☐.*

M. Amrani, F. Jaillet, and B. Shariat, "Deformable Objects Modeling and Animation: Application to Organs' Interactions Simulation" 2000 Heldermann Verlag.*

K. Sundaraj, C. Laugier, I. F. Costa, An approach to LEM modeling: Construction, Collision Detection and Dynamic Simulation Oct. 29-Nov. 3, 2001, IEEE.*

Gacin S. P. Miller; "The motion dynamics of snakes and worms;" Computer Graphics, vol. 22, No. 4, Aug. 1988.

Moten Bro-Nielsen et a.l., "Real-time volumetric deformable models for surgery simulation using finite elements and condensation;" Eurographics'96/J. Rossignac and F. Sillion, vol. 15, 1996, No. 3.

William R. Mark et al.; "Adding force feedback to graphics systems: issues and solutions;" Computer Graphics Proceedings, Annual Conference Series, 1996.

Yan Zhuang et al., "Haptic interaction with global deformations;" Proceeding s of the 2000 IEEE, International Conference on Robotics & Automation, San Francisco, CA , Apr. 2000.

Murat Cenk Cavusoglu et al., "A laparoscopic telesurgical workstation;" IEEE, Transactions Conference on Robotics & Automation, vol. 15, No. 4, Aug. 1999.

V. Vuskovic et al.; "Realistic force feedback for virtual reality based diagnostic surgery simulators;" Proceeding s of the 2000 IEEE, International Conference on Robotics & Automation, San Francisco, CA , Apr. 2000.

Michael Downes et al.; "Virtual environments for training critical skills in laparoscopic surgery;" Medicine Meets Virtual Reality, IOS Press and Ohmsha, 1998.

Stephanie Cotin et al.; "Real-time elastic deformations of soft tissues for surgery simulation;" IEEE Transaction on Visualization and Computer Graphics, vol. 5, No. 1, Jan.-Mar. 1999.

LEM—An approach for physically based soft tissue simulation suitable for haptic interaction Conference Paper, Fifth PHANTOM Users Group Workshop PUG00 Aspen, USA, Oct. 2000. http://www.cs.sandia.gov/SEL/conference/pug00/papers.htm.

Static Solution for Real Time Deformable Objects with Fluid Inside Costa, Ivan and Balaniuk, Remis ERCIM News No. 44—Jan. 2001 http://www.ercim.org/publication/Ercim_News/enw44/costa.html.

* cited by examiner

LONG ELEMENTS METHOD FOR SIMULATION OF DEFORMABLE OBJECTS

BACKGROUND OF THE INVENTION

1. Field of the Invention

The present invention relates generally to deformable object modeling and, more particularly, to a novel long elements method (LEM) of real time simulation of deformable objects in a virtual environment.

2. Description of the Related Art

Deformable object modeling has been known in the art for decades and is widely utilized in fields such as engineering, computer-aided design (CAD), and entertainment. Particularly in a virtual reality (VR) computing environment, the ability to model and manipulate deformable objects is essential to many applications. As such, graphic display of deformable objects has been extensively studied in computer graphics and a number of methods have been proposed accordingly. These prior art methods ranging from non-physical methods, where individual or groups of control points or shape parameters are manually adjusted to shape editing and design, to methods based on continuum mechanics, which account for material properties and internal and external forces on object deformation.

As computational power increases, the ability to simulate physically based deformable models with enhanced multi-modal interactivity, i.e., using graphic and haptic interfaces to manipulate and to change the topology of deformable objects in real time, becomes even more desirable.

A major application area for this desirable real time physically based deformable object modeling with enhanced multi-modal interactivity is the simulation of biomaterials. Physical modeling of biomaterials has a broad range of applications ranging from understanding how soft and hard tissue respond under loading, to patient-specific planning of reconstructive procedures, to the training of surgical skills, and much more. Interaction with these models is necessary in order to impose conditions of interest, to examine results and alternative solutions, to learn surgical procedures by performing them in simulation.

Given the intrinsic physical nature of these models it is desirable to have direct physical interactions with them. "Haptic" or direct physical interaction with simulated objects and/or subjects has become possible in recent years because of advances in haptic (touch) interface technology, with devices now commercially available from companies such as the Immersion Corp. and SensAble Technologies.

Not only does haptic technology enable convenient and expressive direct interactions with biomechanical simulations, it is also well suited to the intrinsically three-dimensional (3D) nature of biological models. Further, it links physical intuition to understanding of models, and, in training and rehearsal situations, it greatly enhances the learning process, much as in music training where one actually learns better and faster with the feeling and fingering of an instrument's keys.

Modeling the biomechanics of muscles, tissues, and organs is intrinsically a computationally difficult undertaking—doing so at haptically real-time rates requires significant computational resources and algorithmic finesse.

What is more, simulation methods must balance between two conflicting demands. Simulation for deformable objects can be classified by the degree of interaction they allow and their accuracy. The usefulness of a simulation method is defined by these two conflicting demands. Models focusing on interactiveness must have low latency and are based in some internal structure suitable for topological changes in real time. Models focusing on accuracy have the precision of their results limited only by some scale factor and the computational power.

Unfortunately, these seemingly conflicting classifications frequently go together. Interactive methods, such as the mass-spring method disclosed by G. Miller in "The motion dynamics of snake and worms", are mainly non-physical and often inaccurate, as pointed out by Zhuang et al. in "Haptic Interaction with Global Deformations", which is hereby incorporated herein by reference. Accurate physically based methods, such as the Finite Elements Method (FEM), are typically simulated off-line and not in real time. What is more, modifying these methods to achieve real time performance usually compromises their accuracy and/or their interactiveness.

Simulation methods can also be classified in accordance with additional aspects. For example, deformations can be dynamic or static, global or local. Models can be elastic or visco-elastic, linear or nonlinear, surface or volumetric. Collision detection and handling can be implemented using different approaches. All these aspects define the way a simulation will behave, its accuracy and performance, and the kind of applications for which it will be well suited.

The distinction between dynamic and static methods is of particular interest here. Dynamic methods simulate the evolving state of a physical system. The bodies have mass and energy distributed throughout. Differential equations and a finite state vector define each model. Numerical integration techniques approximate the system state (position and velocity) at discrete time steps.

In static methods, such physical system is described by equilibrium equations or closed-form expressions, such as those taught by G. S. Chirikjian in "Closed-form primitives for generating volume preserving deformations", which is hereby incorporated herein by reference. These static equations are solved to find a static solution at each time step. In static and quasi-static methods, the time and the system state are usually not considered.

Thus, a state-based approach, i.e., a dynamic method, should be used for more comprehensive and accurate simulations of a deformable object/medium/subject, given significant internal dynamics of the deformable object, as well as the dynamics of the movements (translations and rotations) of the object in space. Note static and quasi-static methods are nonetheless useful in applications where the objects deform but do not move, or move slowly, and the deformable media is highly damped.

A number of schemes implementing these methods for deformable modeling have been developed, most notable ones are: mass-spring damper (MSD) systems, the boundary element method (BEM), the finite difference method (FDM), and the finite element method (FEM), as described by Wu et al. in "Adaptive Nonlinear Finite Elements for Deformable body simulation using dynamic progressive meshes", which is hereby incorporated herein by reference. As is well known in the art and according to Wu et al., these prior art methods have either used approximate methods that are not physically accurate or linear methods that do not produce reasonable global behavior.

For example, particle-based techniques are usually unstable and damping is extensively used to bring the system into a global equilibrium. In a particle-based simulation, damping and other constraints lead to a stiffer system, demanding shorter time steps to achieve stability. The number and distribution of particles is also a source of problems. Larger meshes increase the stiffness of the system and become computationally very expensive. Smaller meshes increase inaccuracies and difficult to preserve volume. Uneven distribution of particles may easily generate unstable interaction forces and non-smooth graphical deformations.

Finite element based methods generally produce globally accurate behavior but are usually too computationally expensive to be simulated in real-time. Pre-computation and condensation can be used to achieve real time rendering rates but changes in topology (re-meshing) demand an update of the stiffness matrix making the pre-computed data useless.

To overcome these deficiencies, Wu et al. described an adaptive meshing scheme based on dynamic progressive meshes (DPM) using nonlinear finite elements. The DPM method has several limitations. For example, it relies on a hierarchy built offline. Thus, an initial detailed mesh is the limit that can be achieved in online refinement. Also, its tree structure has directionality and cannot split a node in any arbitrary direction locally. Consequently, the refined local region does not necessarily achieve optimal mesh quality.

What is needed in the art is a new, computationally simple, fast, portable, and efficient simulation methodology capable of achieving real time performance and optimal mesh quality without compromising either accuracy or interactiveness, overcoming prior art drawbacks and limitations.

BRIEF SUMMARY OF THE INVENTION

Accordingly, it is a primary object of the present invention to provide a novel long elements method (LEM) for real time physically based dynamic simulations of deformable media, the LEM is computationally simple, fast, portable, and efficient, capable of achieving real time performance with optimal mesh quality, interactiveness, and accuracy.

Accordingly, it is also an object of the present invention to provide a new meshing strategy based on the inventive LEM, the LEM is well suited for real time animation and virtual environment multi-modal interactions and particularly useful for soft tissue real time simulation using graphic and haptic rendering.

It is another object of the present invention to provide a static solution based on the inventive LEM for elastic deformations of objects filled with uncompressible fluid, which is a good approximation for biological tissues, wherein the static solution provides globally and physically consistent deformations without pre-calculations or condensations.

It is yet another object of the present invention to provide a novel combination of dynamic and static solutions, wherein the link between a static solution and a dynamic simulation is made using the duality between pressure (stress/strain) and force.

It is therefore an object of the present invention to provide real time physically based modeling systems, methods, and apparatuses utilizing the inventive long elements for dynamic elastic and plastic simulations of deformable media, objects, and subjects, the systems, methods, and apparatuses combining dynamic and static solutions, having a static state-less deformation problem solving means for calculating respective strains caused by internal and external stresses and for providing a static solution thereto, and having an computational means for integrating forces generated by the respective deformation to update the state respectively.

It is a further object of the present invention to provide a static state-less deformation engine that is based on a static solution for elastic deformations of objects filled with uncompressible fluid, wherein the volumes are discretised in a set of the inventive long elements and an equilibrium equation is defined for each such element using dynamic variables including pressure, density, volume, and stress, and wherein the set of static equations, plus Pascal's principle and volume conservation, are used in defining, solving, and finding object deformations and forces, thereby obtaining globally and physically consistent deformations.

Yet another object of the present invention to provide systems, methods, and apparatuses relating to defining an original and efficient three-dimensional (3D) meshing strategy based on the inventive long elements, the novel meshing strategy permitting approximation of state of and strain at any point on a volume with a reduced number of explicitly updated points, wherein number of elements per a meshed model is proportional to square length of a side of the model rather than its cube, thereby requiring substantially less computational power and resources than cubes or tetrahedral based meshing strategies.

It is therefore an object of the present invention to provide systems, methods, and apparatuses based on the inventive long elements, the systems, methods, and apparatuses integrating the simplicity and compliance of the static method to a full 3D dynamic simulation of deformable media, including localized and/or global deformations of elastic, plastic, and/or highly deformable material.

Still further objects and advantages of the present invention will become apparent to one of ordinary skill in the art upon reading and understanding the following drawings and detailed description of the preferred embodiments. As it will be appreciated by one of ordinary skill in the art, the present invention may take various forms and may comprise various components and steps and arrangements thereof. Accordingly, the drawings are for purposes of illustrating a preferred embodiment(s) of the present invention and are not to be construed as limiting the present invention.

DETAILED DESCRIPTION OF THE INVENTION

Known methods, procedures, systems, components, as well as computing environment, may be discussed or illustrated in the drawings, description and discussion herein without giving details, so as to avoid obscuring the principles of the invention.

A survey of deformable modeling in computer graphics can be found in "A survey of deformable models in computer graphics" by Gibson et al. Exemplary teachings on deformable modeling employing different prior art methods, including the interactive methods, the "Geometric Nonlinear Finite Element Method", and the "Boundary Element Method", can be found in the following publications, which are hereby incorporated herein by reference:
1. James et al., "Artdefo accurate real time deformable objects", *Computer Graphics*, v. 33, 65-72, 1999.
2. Bro-Nielsen et al., "Real-time volumetric deformable models for surgery simulation using finite elements and condensation", *Proceedings, Eurographics—Computer Graphics Forum*, 57-66, 1996.
3. Cavusoglu et al., "A laparoscopic telesurgical workstation", *IEEE Transactions on Robotics and Automation*, 15(4), 728-739, 1999.
4. Vuskovic et al., "Realistic force feedback for virtual reality based diagnostic surgery simulators", *Proceedings, IEEE Intl. Conf. On Robotics and Automation—ICRA*, 1592-1598, 2000.
5. Downes et al., "Virtual environments for training critical skills in laparoscopic surgery", *Proc. Medicine Meets Virtual Reality*, 6, 316-322, 1998.
6. d'Aulignac et al., "A haptic interface for a virtual exam of the human thigh", *Proceedings, IEEE Intl. Conf. On Robotics and Automation—ICRA*, 2452-2457, 2000.
7. Cotin et al., "Real-time elastic deformations of soft tissues for surgery simulation", *IEEE Transaction on Visualization on Computer Graphics*, 5(1), 62-73, 1999.

As previously discussed, deformations can be dynamic or static, global or local. Models can be elastic or visco-elastic, linear or nonlinear, surface or volumetric. Collision detection and handling can be implemented using different approaches. All these aspects define the way a simulation will behave, its accuracy and performance, and the kind of applications for which it will be well suited.

The present invention is well suited for soft tissue real time simulation, particularly for surgical simulation. Deterministic factors for such suitability include: unrestricted multi-modal interactiveness, including interactive topological changes (cutting, suturing, removing material, etc.), physically based behavior, volumetric modeling (homogeneous and non-homogeneous materials) and scalability (high accuracy when needed).

According to an aspect of the present invention, a static solution based on the inventive long elements is provided for elastic deformations of objects filled with uncompressible fluid, which is a good approximation for biological tissues. The volumes are discretised in a set of static Long Elements (LE), and an equilibrium equation is defined for each element using dynamic variables. These dynamic variables or "states" are used to collectively refer to quantities that may vary significantly during simulation such as: pressure, volume, stress, strain, position, density, velocity, etc. The set of static equations, plus Pascal's principle and the volume conservation/preservation, are used to define a system that is solved to find the object deformations and forces. As a result, global and physically consistent deformations are obtained. Detailed mathematical solution, as well as a generic soft tissue VR simulator implemented in C++ in a Windows NT platform are disclosed in Applicants' recent publication, "LEM—An approach for physically based soft tissue simulation suitable for haptic interaction", Conference Paper, *Fifth PHANTOM Users Group Workshop*, October 2000, which is hereby expressly incorporated herein by reference.

According to another aspect of the present invention, a combination of dynamic and static approaches is provided for dynamic simulation of deformable media using the inventive long elements. According to the teachings disclosed herein, a static state-less deformation engine in a state-based system solves the deformation problem for a given input of internal and external stresses calculating the respective strains while a dynamic simulation engine integrates the forces generated by the deformation to update the state of the system accordingly.

To simulate a state based system according to another embodiment of the present invention, the novel static LEM is extended and linked to a dynamic method based on the same long elements meshing strategy. The present invention further provides a novel 3D integrator for providing a 3D dynamic simulation and for linking the dynamic and static simulations.

The present invention combines the simplicity and compliance of the static method with a 3D dynamic simulation of the deformable media. Highly deformable material, whether compressible or incompressible, can be simulated. Localized or global deformations can be simulated. The inventive long elements define an original and efficient 3D meshing strategy that permits the approximation of the state and the strain at any point in a volume from a reduced number of explicitly updated points while preserving/conserving the volume. The reduced, $b^2$ complexity of a LEM based meshing strategy, where b is the length of a side of the meshing subject, greatly shortens corresponding computing time and thus enhances simulation speed and performance, allowing fast and realistic interactive applications. For example, the complexity of collision detection may be simplified utilizing the LEM. Similarly, a LEM based simulation can simplify making topology changes such as cutting and removing material, enabling real time feedback and making it well suited for virtual surgical procedures. Furthermore, simulation models based on the inventive LEM may be superimposed. Superposition of these models permits modeling inhomogeneous materials such as hard tumor in soft tissue. Potential LEM applications include industrial design, character and animated object simulation, real time simulation of objects ranging from furniture to human organs.

Figure 1:
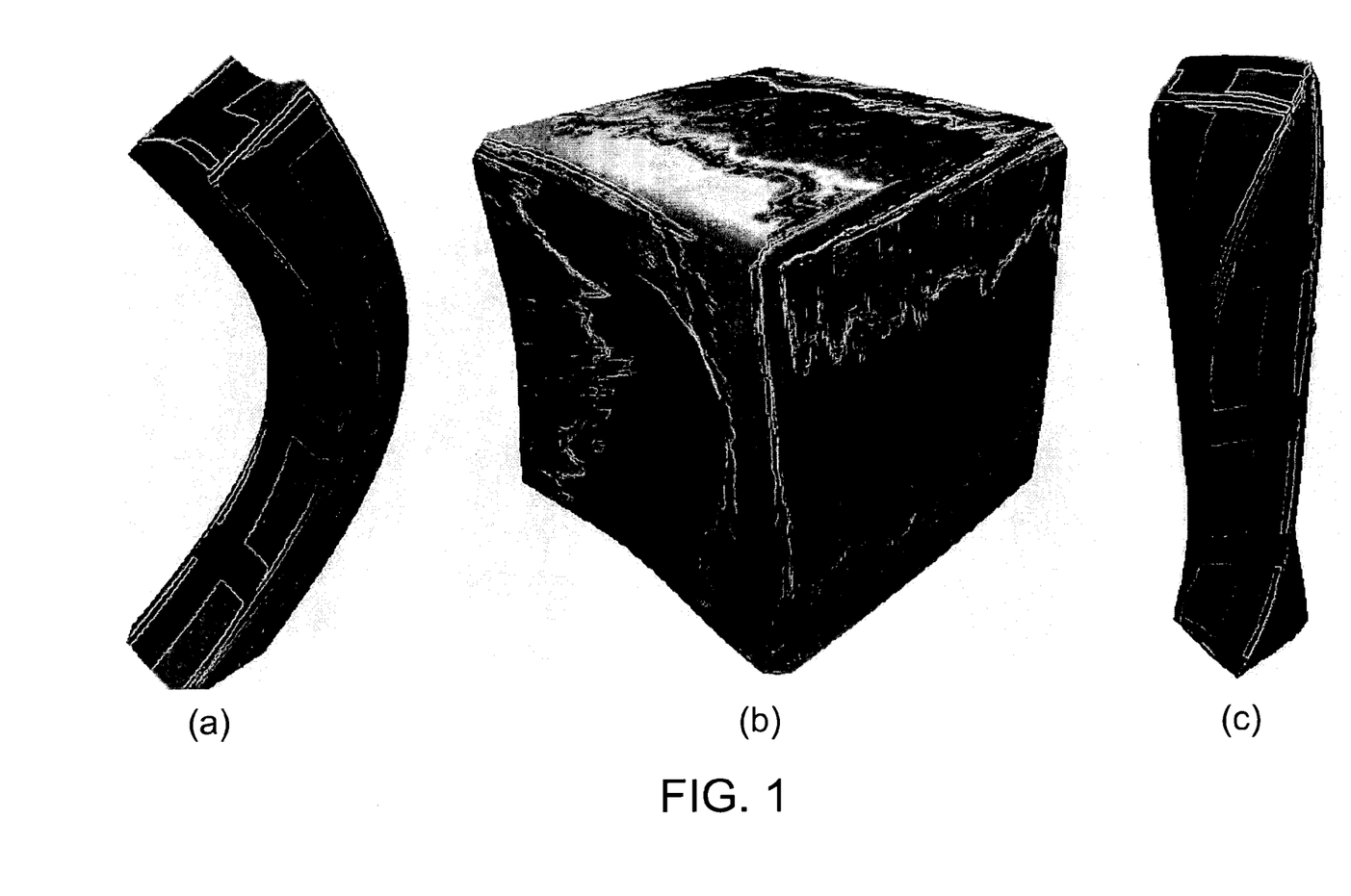
FIG. 1 shows soft-tissue simulations according to an embodiment of the present invention. In these simulations, (a) bend; (b) palpation; and (c) twist, global and physically consistent deformation are obtained.

FIG. 1 illustrates exemplary LEM based simulations, showing the bend of an elastic rod (a), a palpation of a soft object with a rigid haptic probe (b), and a twist of the rod (c).

1. Long Elements (LE)

The state of a deformable object at a given instant t is ultimately defined by the state of all its points at t. In order to simulate such an object in a computer at discrete time steps simplifications and approximations need to be done. In particle-based methods, the physics of a finite number of points of the object are simulated and a collective behavior is obtained with simplified links between them (springs, dampers, etc.).

In finite element methods, limited volumetric forms inside the object are simulated (cubes, tetrahedral, etc.) and a continuous behavior is obtained with boundary conditions at points shared by multiple elements.

The LE method explores a different kind of approximation, based on the decomposition of the object internal mechanics. This decomposition is based on three reference planes that cross the object and on the simulation of the relative positions of points inside the object with respect to these reference planes.

1.1 Static Mesh

Consider that at a given instant t in time three orthogonal planes $P_x$, $P_y$, and $P_z$ cross a deformable object or medium and suppose that a point O at the intersection of the 3 planes is inside the object such that the position of any point of the object can be uniquely defined by its distances to the reference planes $P_x$, $P_y$, and $P_z$.

Define S as a set of points inside the object belonging to $P_x$, $P_y$, or $P_z$ at t. Suppose that the rest of the points inside the object are connected to the points in S by imaginary threads. Suppose that for each point P in S exist two threads connecting points between P and the surface of the object in opposite directions. A thread can be a straight-line segment starting in P and normal to its reference plane, for example, or it can have an arbitrary form, as discussed herein. Each point on the object belongs to exactly three threads, each one originating from a different orthogonal plane.

Figure 2:
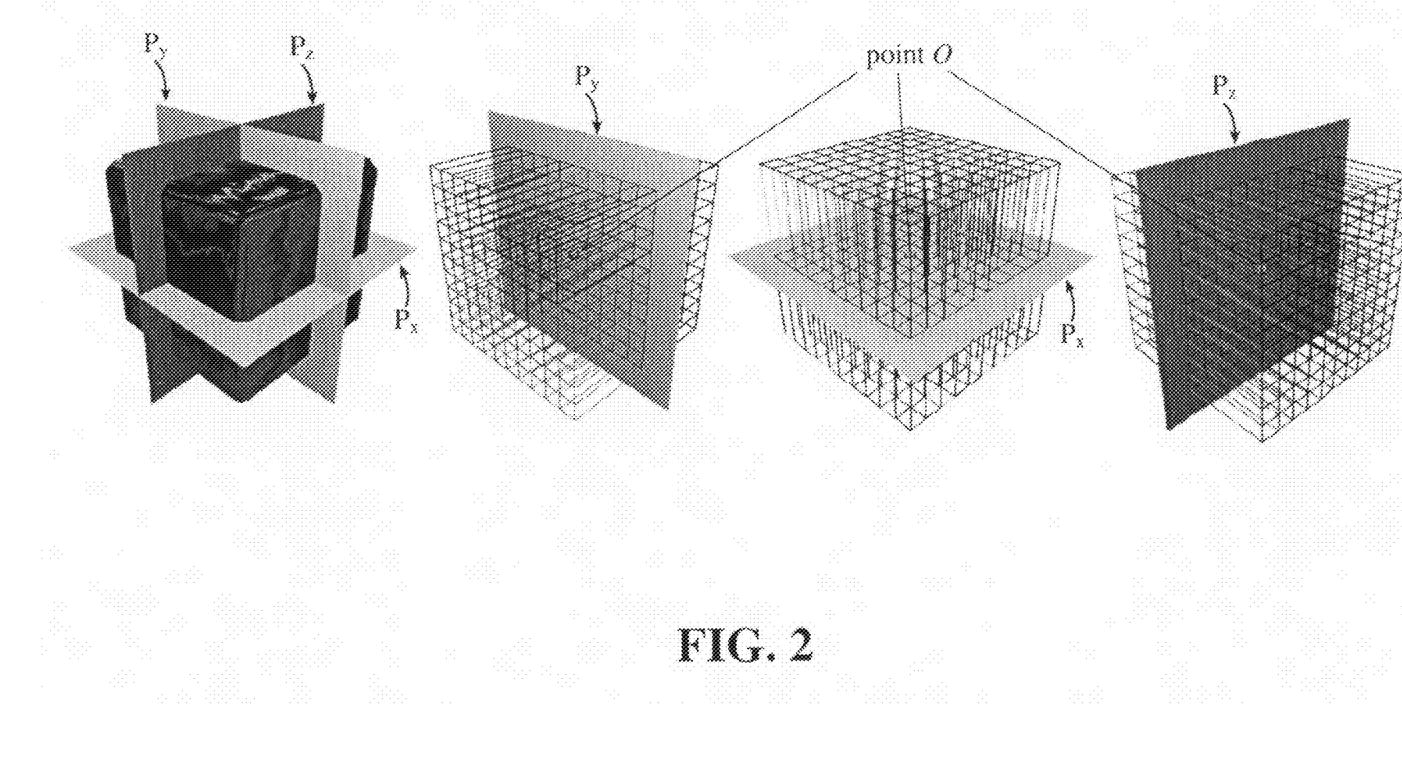
FIG. 2 shows a deformable medium, a cube, meshed in the inventive long elements according to the principles of the present invention.

On a finite implementation, the cross sections defined by the reference planes are divided in polygons and the threads become long rods, i.e., Long Elements (LE), crossing the object. FIG. 2 shows the meshing of a cube in LEs normal to each reference plane. The three orthogonal planes intersect at point O.

Figure 3:
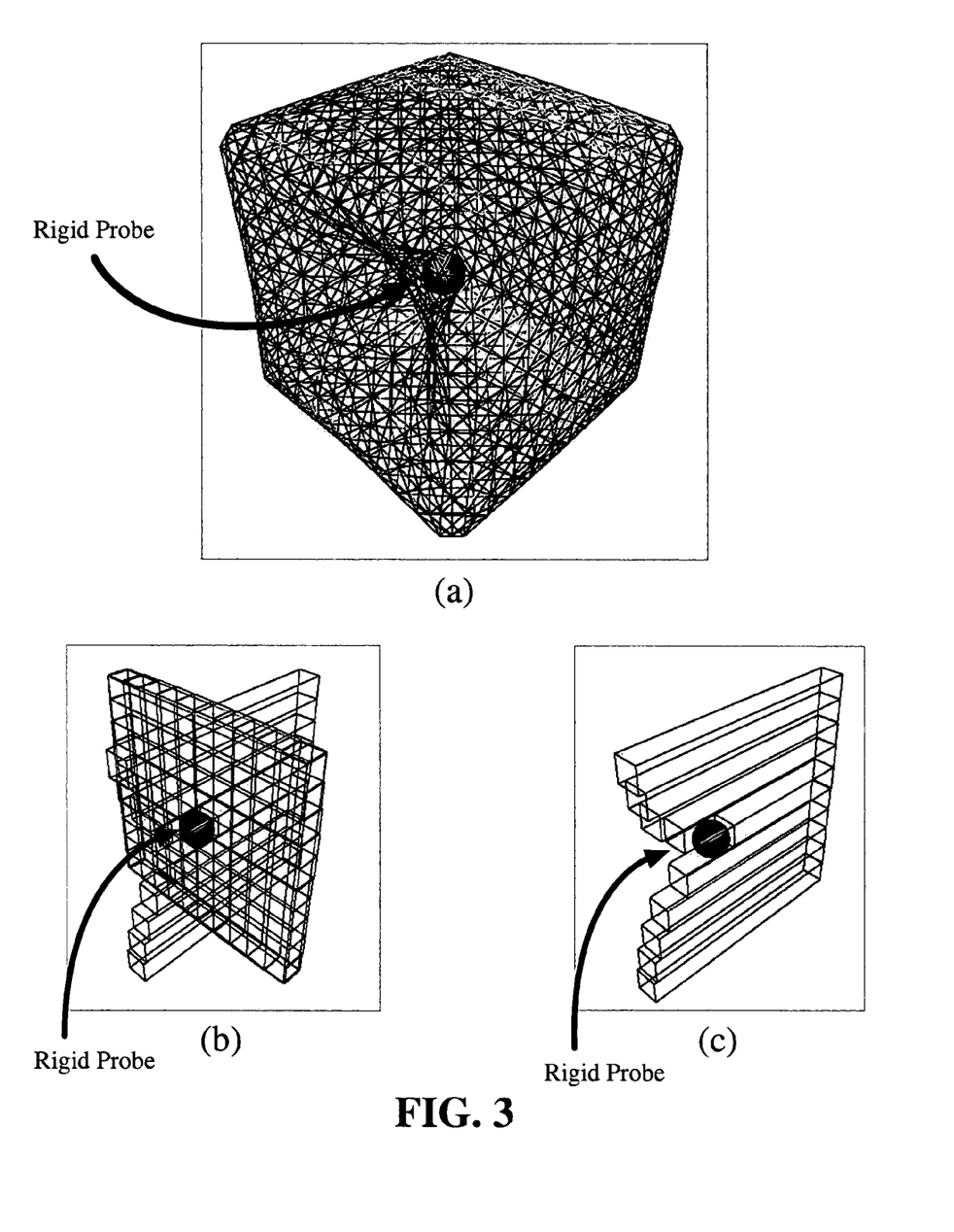
FIG. 3 shows modeling a deformable medium touched by a rigid probe according to an aspect of the present invention, wherein (a) shows the meshed model in wire mode; (b) shows three orthogonal planes crossing the deformable medium, each plane consisting of the inventive long elements; and (c) shows one of the three planes that is affected by the rigid probe.
Figure 4:
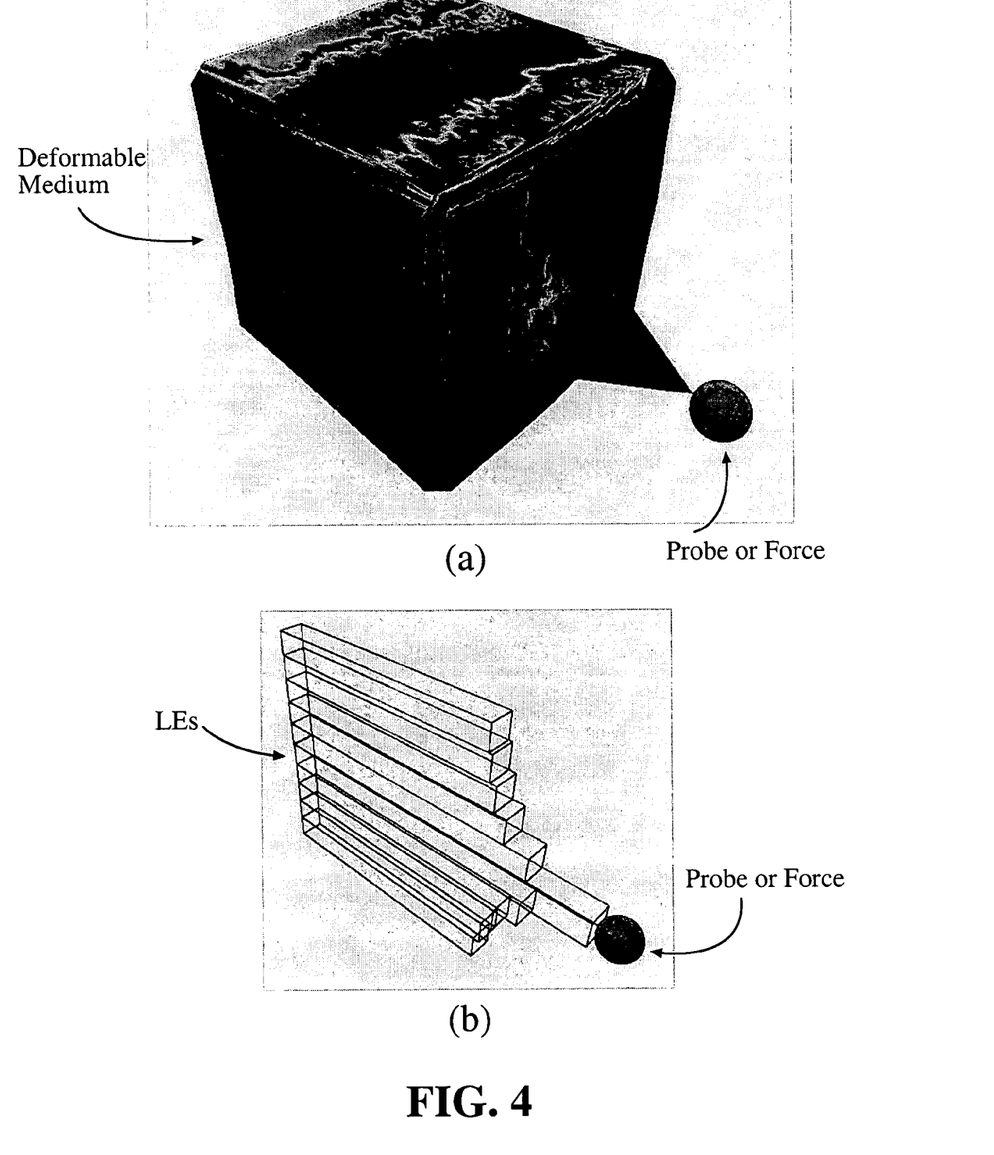
FIG. 4 shows another aspect of the present invention where (a) shows a deformable medium being pulled by a probe or force and (b) shows a plane of long elements affected by the probe or force.

FIGS. 3 and 4 show examplary meshing strategies based on the inventive LEs. FIG. 3 shows modeling a deformable medium touched by a rigid probe according to an aspect of the present invention. In FIG. 3, (a) shows the meshed model in wire mode; (b) shows three orthogonal planes crossing the deformable medium, each plane consisting of the inventive LEs normal to the plane; and (c) shows one of the three planes that is affected by the rigid probe. As shown in FIG. 3, only LEs normal to the plane being affected by the rigid probe are deformed. Note although in FIG. 3 the reference planes are three mutually orthogonal planes, more or less than three planes may be used and they may or may not be orthogonal. Furthermore, the planes may be replaced in general by surfaces. The LEs may be used to represent objects of higher or lower dimension than three, i.e., planar objects, hypercubes, etc. In FIG. 4, (a) shows a deformable medium being pulled by a probe or force and (b) shows a plane of long elements affected by the probe or force. Again, only LEs normal to the plane being affected by the probe or force are deformed.

1.2 Free Form Long Elements

The simplified straight LEs on FIG. 2, normal to the reference plane, define a 1:1 relation between length of the LE and the distance from its reference plane.

A generic LE can be defined if for each point (or section in a finite implementation) inside the LE the first order derivative $\partial d = \partial L$ of the distance d with respect to the partial length L is known. In this case, the LE can have any arbitrary form. The approximation of the distance from the plane at any point of a LE can be done by integrating $\Sigma \partial d/\partial L \Delta L$ at discrete steps $\Delta L$.

In general, the LEM "meshes" or represents an object modeled in one space, e.g., 3D, by projecting the object's original representation (shape, state, properties, etc.) into a plurality of representations in lower dimensional space(s). Simulation of objects' behavior can be performed to advantage in these several lower dimensional spaces and the results are thereafter combined and projected back into the original higher dimensional space. As such, different meshing strategies can be conceived to fill/mesh/represent different objects with different forms of LEs. For example, in a Cartesian implementation, the LEs are parallel to the Cartesian axis and cross the deformable medium. One mesh defines one face of the medium. Multiple meshes can then be combined to obtain a full 3D deformable medium.

2. Deformation Engine

To simulate a deformable elastic medium, each LE is modeled as a spring. A static method disclosed herein is used to estimate the length of each spring-like LE based on the pressures and tensions applied thereto. In a system utilizing such static stateless deformation method, the LEs are springs only and have no mass. In one aspect of the present invention, the simulated materials are assumed to be incompressible. For example, a deformable object maybe simulated as a volume filled with uncompressible fluid. This implicitly defines the material's Poisson's ratio to be 0.5. However, by means well known in the field of the mechanics of materials, the LEM could be modified to explicitly take account of other appropriate values of Poisson's ratio to enable modeling and simulation of compressible materials.

2.1 Pressure and Stress

Figure 5:
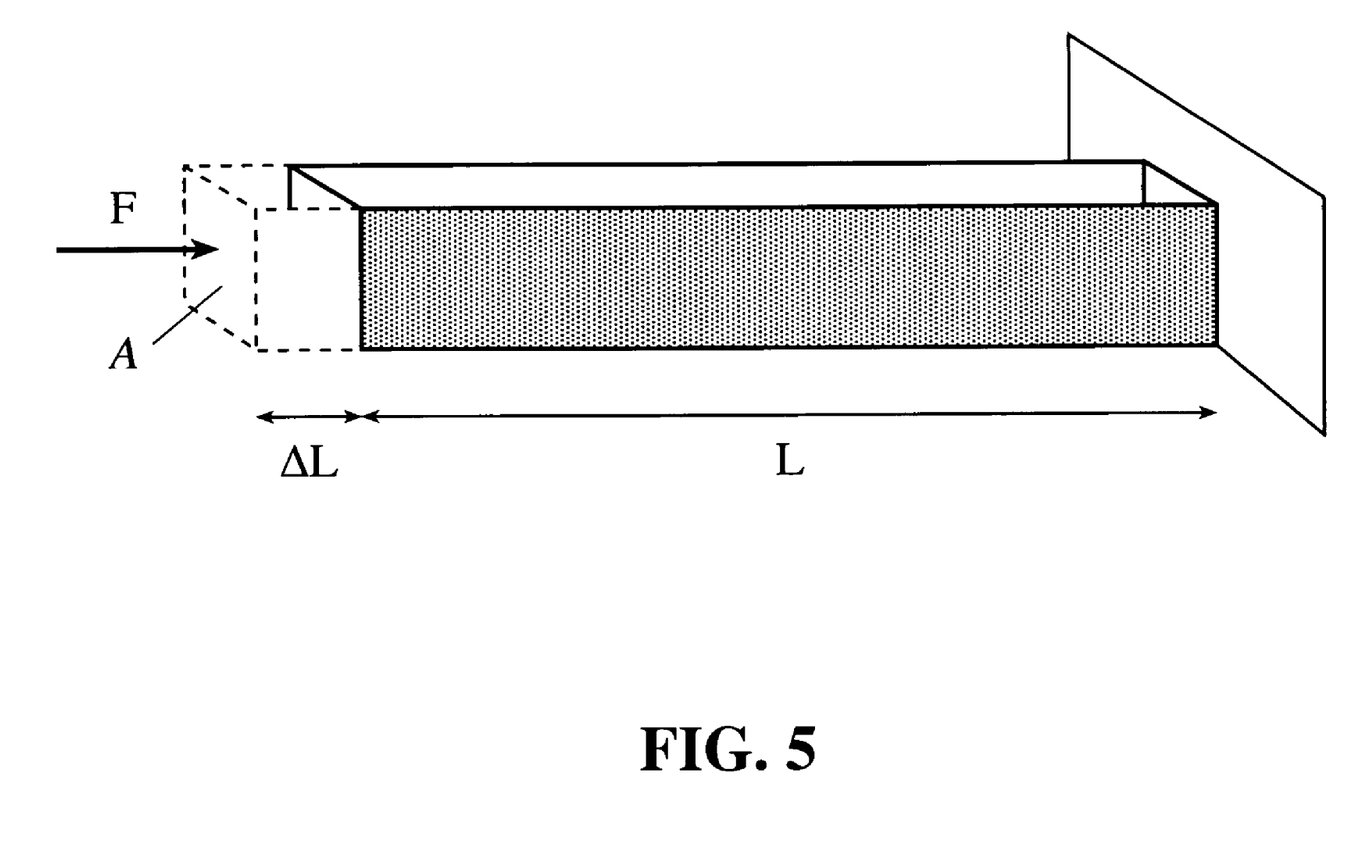
FIG. 5 is a schematic drawing of the inventive mass-less long element according to an embodiment of the present invention.

Consider the mass-less long elastic element illustrated in FIG. 5. The force F per unit of area A is defined as pressure: P=F/A. The force per area unit producing the deformation is also the stress.

For small forces applied, the stress s in a material is usually linearly related to its deformation (its change in length in the long elastic object). Defining elasticity E as the variable relating stress s and the fractional change in length: $\Delta L/L$, it is possible to write:

$$s = E\Delta L/L. \qquad (1)$$

Since the stress s is related to the fractional change in length, the force can be related to the elongation $\Delta L$ in the well known form:

$$F = k\Delta L \qquad (2)$$

where $$k = AE/L \qquad (3)$$

Note that k is not constant, but it depends on the length L. Note also pressure may be made time varying to enable simulation of, for example, pulsing fluid flow internal to a body.

2.2 Static Solution

The static condition states that the forces, or pressures, in one sense have a correspondent of the same magnitude in the contrary sense on each point of the surface of the object, or $P_{int} = P_{ext}$. The external pressure $P_{ext}$ on the surface is affected by the atmospheric pressure and by the stress when an elongation exists, so $$P_{ext} = P_{atm} + E\Delta L/L. \qquad (4)$$

Note the surface tension also affects the external pressure, as described herein.

Considering that the object is filled by fluid, the internal pressure ($P_{int}$) is formed by the pressure of the fluid (without gravity) and the effect of the gravity acceleration (g), such that $$P_{int}=P_{fluid}+dgh \quad (5)$$

where h is the distance between the upper part of the fluid and the point where the pressure is calculated.

From the last three equations, a continuous equation can be obtained as $$E\Delta L/L - \Delta P = dgh \quad (6)$$

where $\Delta P = P_{fluid} - P_{atm}$.

Another external pressure to be considered comes from the contacts between the object and its environment. Two situations are considered: a soft contact and a rigid contact between the object and its environment. In a rigid contact, the elongation $\Delta L$ is defined by the penetration of the contact in order to make the surface follow a contact position (y). Accordingly, the equation (6) can be rewritten for the elements where there is external rigid contact as $$\Delta L = y \quad (7)$$

In a soft contact, it is not the position but the force of the contact that is being considered. To obey the action-reaction law, the force applied to the external contact and to the object must have the same magnitude. This means that the external pressure applied by the contact, $P_{env}$, must be equal to $P_{env}=P_{ext}-P_{int}$. At the points on the object surface, where external contacts exist, a term is added to the right side of the equation (6), such that $$E\Delta L/L - \Delta P = dgh + P_{env} \quad (8)$$

2.3 Simulating Long Elements

A volume is filled (meshed) using LEs. An equilibrium equation is defined for each element based on the stated principles expressed in equations (6)-(8). Global constraints are added in order to obtain a global physical behavior.

A LE can be compared to a spring fixed in one extremity with the other extremity attached to a point in a deformable object surface. These LEs are relaxed when the object is not touched, i.e., not deformed. The spring constant $K_i$ depends on the LE's length L, as demonstrated in the equation (3).

The force due to each LE has a magnitude given by the equation (2) in the direction of the spring. A LE does not occupy real space and has no mass. In one embodiment, the real space inside the deformable medium is occupied by some incompressible fluid of density d'.

To make the connection between the elements, two border conditions are applied:

1. Pascal's principle states that an external pressure applied to a fluid confined within a closed container is transmitted undiminished throughout the entire fluid. Mathematically:

$$\Delta P_i = \Delta P_j \text{ for any i and j.} \quad (9)$$

2. The fluid is considered incompressible. This means that the volume conservation must be guaranteed when there is some external contact to the object. The volume dislocated by the contact will cause the dislocation of the entire surface. In other words, the variation of volume due to the elements touched by the contact have to be equal to the sum of the volume created by the dislocation of all untouched elements to ensure the volume conservation $$\sum_{i=1}^{n} A_i \Delta L_i = 0 \quad (10)$$

where n is the total number of long elements. This equation ensures the conservation of volume defined by the number of the LEs, implying the conservation of the object volume.

The volumetric discretisation adopted by the static solution based on the inventive LEs has two main advantages: the number of LEs used to fill a deformable object is one dimension less than in a discretisation based on tetrahedric or cubic elements; the simulation for graphic and haptic feedback is thus greatly simplified and can be directly derived from the LEs. No intermediate geometric representation of the deformable object is needed. The use of static equations avoids problems related to numerical integration, ensuring stability for the simulation. Additionally, no pre-calculations or condensations are used, enabling real time topology changes. The static solution is particularly well suited to topological changes such as cutting because it intrinsically preserves volume.

2.4 Surface Tension

Figure 6:
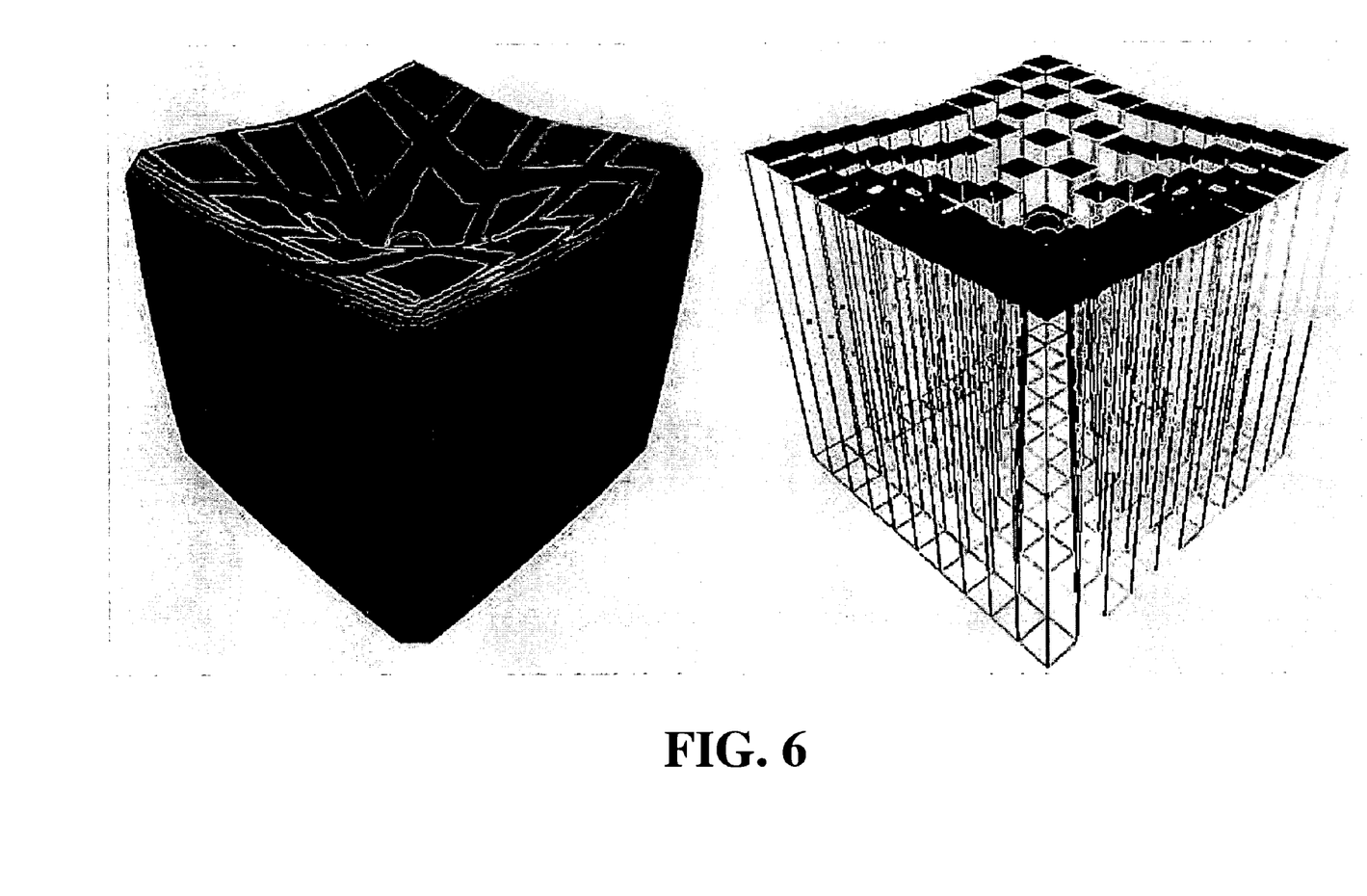
FIG. 6 illustrates the effect of surface tension in a simulation system according an aspect of the present invention.

Deformations cause a change on the surface area of the deformable object, even if the object volume is kept constant. FIG. 6 illustrates the effect of such surface tension. This change creates forces on the surface generating a surface tension. One of the effects of these forces in a deformable object is to make the contours of the surface smoother.

To reproduce these forces due to the change on the surface area, linear elastic connections are included between neighbor long elements coupling their changes in length. A number of terms are added to the right side of the equation 4 corresponding to the neighborhood considered around element. These terms are of the form P=F/A=kx/A, where x is the difference between the deformations of a long element and its neighbor and k is a local spring constant. Thus, for a given LE i, the term relating its deformation to the deformation of its neighbor j is $$k_{ij}(\Delta L_i - \Delta L_j)/A_i \quad (11)$$

2.5 Mathematical Solution

Equations (8), (9) and (11) define the final equation for a long element i untouched, i.e., $P_{env}=0$, or in soft contact with the environment. Considering n neighbors ($j_1$ to $j_n$), $$(E_i/L_i + nk_s/A)\Delta L_i - k_s(\Delta L_{j1} + \ldots + \Delta L_{jn})/A - \Delta P = \quad (12)$$
$$d_i g_i h_i + P_{envi} + P_{orthoi}$$

where the superficial spring constant $k_s$ and A were chosen constant for all elements to make the notation easier. Note "superficial spring constant" is used here to represent the stiffness between adjacent endpoints of neighboring LEMs. Note also $k_s$ can be defined locally by the averaged elasticity of the specific elements. The term $P_{orthoi}$ represents an internal stress defined herein.

The untouched LEs and the LEs in soft contact with the environment (12) plus the LEs in rigid contact with the environment (7) define a set of N equations, where N is the number of LEs used to fill the object. Adding the equation of volume conservation (10), there are N+1 equations and N+1 unknowns: the pressure ($\Delta P$) and the deformation of each element ($\Delta L_i$ for i=1 to N).

These N+1 equations can be written as a problem of the type A.x=B where A is a sparse matrix. The problem and thus the corresponding simulation system can be solved using fast standard numerical methods. If rigid contacts are considered, the A matrix changes when the set of constrained LEs change, requiring a new matrix inversion $A^{-1}$. However, if only soft contacts are considered, as is the case for typical medical simulation scenarios, the changes occur only on the B vector of pressures and gravity effects, and only matrix X vector multiplications are needed to obtain the deformation vector x.

3. 3D Integrator

Figure 7:
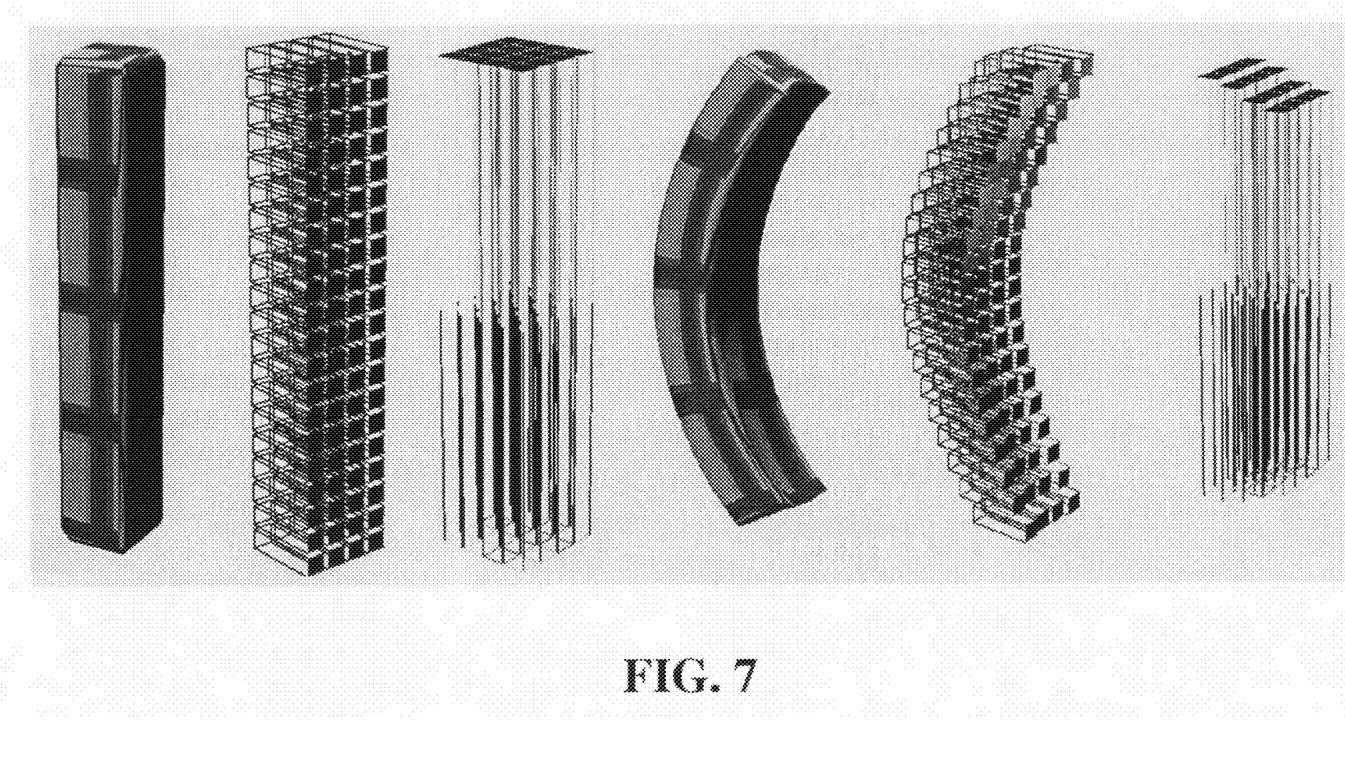
FIG. 7 illustrates yet another embodiment of the present invention where simulation of a deformable medium occurs in two different types of space simultaneously.

According to an aspect of the present invention, simulation of a deformable medium occurs in two different types of spaces simultaneously: in one-dimensional (1D) LE space, and in three-dimensional (3D) Cartesian space. In the LE space, the LEs are always straight, parallel and homogeneous. As illustrated in FIG. 7, the 3D shape of an object is derived from the configuration of the LEs.

The transformation between the state of the LEs within the LE space to the state of the object in 3D is made considering one reference point O inside the object whose state in both spaces are coincident and estimating the position of all other points in 3D with respect to it.

3.1 Dynamic Long Element

Figure 8:
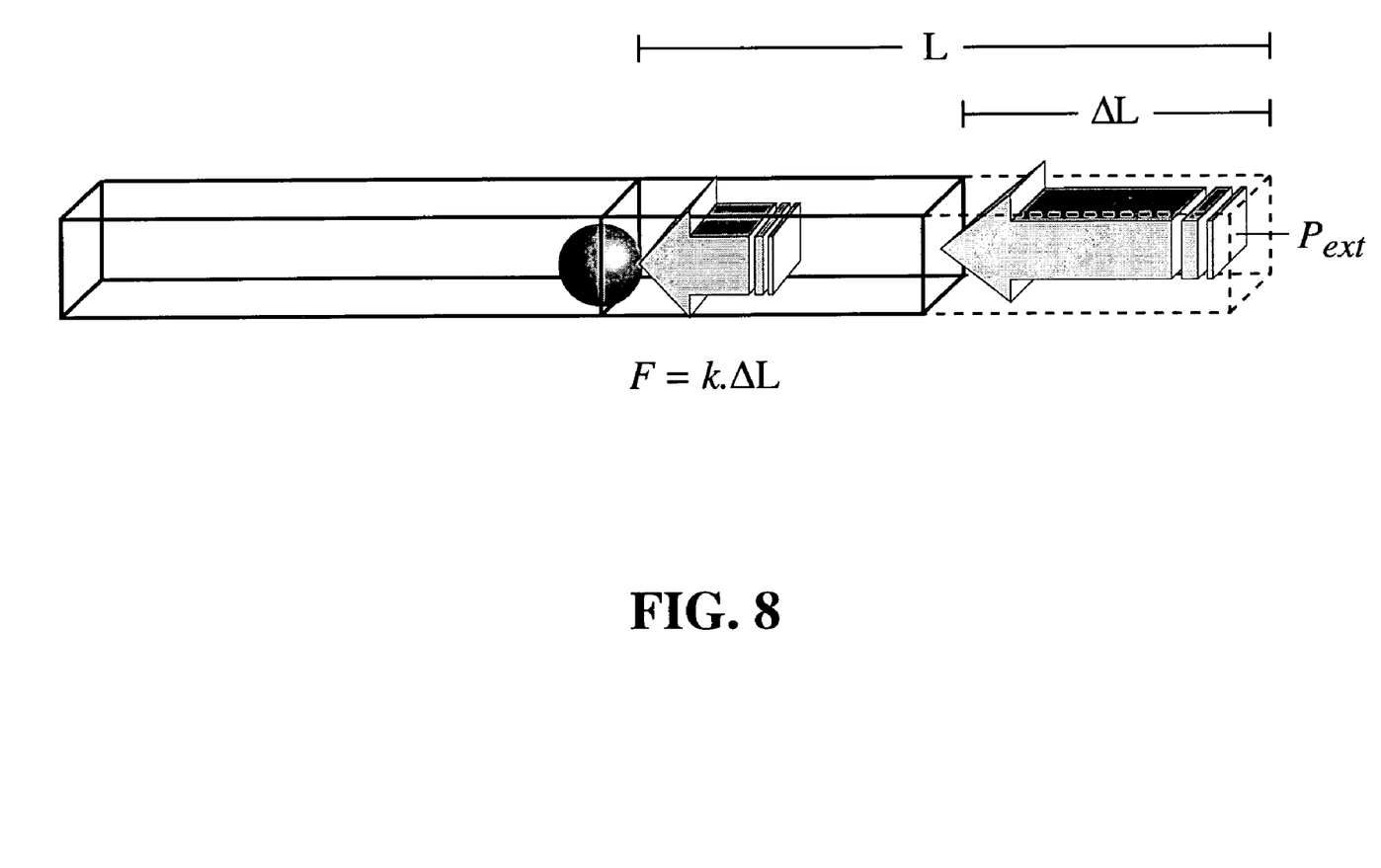
FIG. 8 is a schematic drawing of the inventive spring-like dynamic long element according to another embodiment of the present invention.

The same massless LE described herein using a static formalism in equations (4) through (12) can be described as an energy-storing device. Elastic potential energy due to either compression or stretching can be simulated to create forces and derive a state for each element.

The LE is now modeled as a spring attached to a particle with a known mass. As shown in FIG. 8, A combination of two LEs attached to the same particle is used as the basic element to mesh the volumes. The LE is an one-dimension entity, defined by its length L. The particle attached to it is defined by a mass m and a state in an one-dimensional space as well. A deformed LE creates a force that is applied to the particle accelerating it. The mass of the particle corresponds to the mass of the material inside the LEs connected to it.

The particles belong to the set S of points as previously defined. Those are the only points where forces are known inside the object. For each particle, one scalar value is given, representing a component of the force vector at that point normal to the reference plane of which the particle belongs. An explicit integration of the state of the particle is done at each time step in one dimension. The result is two scalar values, displacement and velocity of the particle with respect to the reference plane.

According to the present invention, displacement means the length of an arbitrary trajectory and distance means the length of the shortest trajectory between two points (or between a point and a plane). Furthermore, a cell is a unit of volume defined by 3 crossing LEs. Each point of the object belongs to only one cell.

The state at any point of the object can be approximated using the state of its three crossing LEs. Each LE is used to estimate the distance from the point to the LE reference plane. The estimation of this distance is made using the state of the LE's particle plus the relative position of the point inside that LE, the partial lengths of the cells and the derivatives $\partial d = \partial L$ of the distance d to the reference plane with respect to the length L.

The 3D Integrator according to the present invention is capable of performing the following four tasks: integrating the 1D state of the particles, estimating the distances from the particles to their reference planes (the particle's position), estimating the numerical derivatives of the distance with respect to the length for each cell, and estimating internal stress at each cell.

3.2 Generating Forces from Deformations

On the LE space, only scalar values are being estimated: deformation, force, acceleration, velocity and position. The displacements of the particles are estimated at each time step. The dynamics on this space are very simplified. The LEs are modeled as springs attached to particles. For the dynamic LE configuration illustrated in FIG. 8, and using equations (2) and (3), the force F applied to a particle p attached to LEs $L_i$ and $L_j$ is defined by $$F = k(\Delta L_i - \Delta L_j). \tag{13}$$

This force is used to integrate the acceleration, velocity and position of the particle. The position corresponds to the displacement from the reference plane.

3.3 Estimating the Position of a Particle

The origin O belongs to all three reference planes and is simulated using the same decomposition in three integrations. For each time step, the displacements of O decomposed on the three directions and these displacement values correspond to the distances from O to the reference planes (this is true only for O). The reference planes are static and defined at the beginning of the simulation.

For a point O of the object, if the distance $\|OO\|$ does not change between t and t1, and the velocity vectors $O' \neq O'$ then O described a spherical trajectory (a rotation) relative to O during this interval, that can be approximated by an arc connecting its initial and final relative positions. On the other hand, if the distance $\|OO\|$ changes between t and t1, the trajectory can still be described as following a sphere having radius varying in time.

To estimate the distance from a particle Z to its reference plane, consider that the position of O indicates the translation of the whole object (inside the coordinate system defined by the reference planes) and that the difference between the displacements of O and Z indicates a rotation of Z about O.

For each particle, two reference points are defined and they correspond to their respective closest point on each line defined by the intersection of its reference plane and each of the other two planes. We suppose that the distances between a particle and its reference points are always known.

To estimate the relative position of a particle Z with respect to O considering the spherical trajectory, compute the rotation of the particle about an axis crossing O. A 3D rotation of a point about an arbitrary axis is defined by $$r = M.q \tag{14}$$

where M is a 3×3 matrix, $q = [q_x, q_y, q_z]$, the initial position, and $r = [r_x, r_y, r_z]$, the final position of the point.

If a vector $o = [o_x, o_y, o_z]$ represents the position of O, then the final position of Z considering translation and rotation is defined by $Z' = [z'_x, z'_y, z'_z] = [r_x + o_x, r_y + o_y, r_z + o_z]$. M is defined as:

$$M = uu^T + (\cos(a))(I - uu^T) + \sin(a)S \tag{15}$$

where a is the rotation angle and u the rotation axis.

The rotation axis u is defined by an unitary directional vector $u=v/\|v\|=(x',y',z')^T$. S is defined as:

$$S = \begin{vmatrix} 0 & -z' & y' \\ z' & 0 & -x' \\ -y' & x' & 0 \end{vmatrix}$$

Considering $i, j, k \in \{x, y, z\}$ and a particle Z belonging to the plane $P_i$, $R_j$ is defined as the reference point at the intersection between plane $P_i$ and $P_j$ and $R_k$ is defined as the reference point at the intersection between plane $P_i$ and $P_k$. Two scalar values $d_j$, $d_k$ are defined as $d_j=z-r_j$ and $d_k=p-r_k$ where z is the displacement of Z, $r_j$ is the displacement of $R_j$ and $r_k$ is the displacement of $R_k$. The vector v is defined using $v_i=0$, $v_j=d_k$ and $v_k=-d_j$.

The angle a of the rotation is defined by the difference z–o between the displacements of Z and O and the distance $d_{Zv}$ between Z and the rotation axis v. Z is describing a circle around v, whose arc corresponds to z–o. From the equation of the arc of a circle: $L=\phi \cdot d_{Zv}$, where $d_{Zv}$ is the radius of the circle and $L=z-o$, the angle $\phi$ is obtained:

$$\phi=(z-o)/d_{Zv} \quad (16)$$

Because Z belongs to $P_i$ then $q_i=0$. $q_j=\|ZR_j\|$ and $q_k=\|ZR_k\|$. As a result, $z'_i$ gives the distance from the particle to the plane $P_i$. $z'_j$ and $z'_k$ are not relevant.

The bend illustrated in FIG. 7 is a good example of the rotation of parts of the object. On the horizontal mesh space, from the center of the mesh to its extremities, a gradual increase of the relative displacements can be seen between vertical neighbors. In 3D, the result is a gradual inclination of the object caused by the increasing rotations of the LEs.

3.4 Local Angles and Partial Derivatives

The same rotational analysis is used at the cells level to determine internal deformations. The goal here is to determine cell by cell the deformation of a LE. A length and a directional vector are defined for each cell in order to describe its shape. Corresponding partial derivatives are determined and internal stress on the cell is estimated. The change in length of each cell in a LE is defined by local pressure. Partial lengths are approximated using methods disclosed herein.

The position of a cell c inside a LE corresponds to the sum of the partial lengths of all cells disposed between c and the particle. This position changes with the deformation of the LE. Neighbor LEs are those disposed side by side on the mesh. Neighbor cells are those disposed at the same position in neighbor LEs when the object is at rest.

Considering $i, j, k \in \{x, y, z\}$ and a LE $L_i$ based on plane $P_i$. Two neighbors $L'_i$, $L''_i$ are selected on the directions going from $L_i$ to its reference points. Suppose the directional vector at cell $c_{i,n}$ in $L_i$ is to be defined. In each neighbor LE, there is a corresponding neighbor cell $c'_{i,n}$, $c''_{i,n}$. The positions of the cells $c_{i,n}$, $c'_{i,n}$, and $c''_{i,n}$ are $p_{i,n}$, $p'_{i,n}$, and $p''_{i,n}$, respectively. The displacements of the LEs $L_i$, $L'_i$, $L''_i$, i.e., displacement of the particles with respect to $p_i$, are $p_i$, $p'_i$, and $p''_i$, respectively. Two differences $d_1$, $d_2$ are defined as:

$$d_{1,n} = ((p'_i + p'_{i,n}) - (p_i + p_{i,n})) \quad (17)$$

$$d_{2,n} = ((p''_i + p''_{i,n}) - (p_i + p_{i,n})) \quad (18)$$

The bend of $L_i$ at cell $c_{i,n}$ can be described as a directional vector. The bending vector is approximated using the same analogy of a rotation with respect to a reference point. The differences $d_{1,n}$, $d_{2,n}$ define a local torsion of $L_i$. The torsion is approximated as a rotation of the cell about a point on the intersection between the three neighbor cells. Equation (14) is used to estimate the directional vector $r_n=r_x$, $r_y$, $r_z$. The input vector q is defined as: $q_i=1$; $q_j=0$; $q_k=0$ and the rotational axis v as $v_i=0$; $v_j=d_{2,n}$, $v_k=-d_{1,n}$.

Using the same analogy of an arc of circle, angle a of the rotation is defined using the local "width" and "height" of the cell, the rotational axis and the differences $d_{1,n}$, $d_{2,n}$. At each cell n in $L_i$ there is a crossing with a LE $L_{j,n}$ based on the plane $P_j$, and with a LE $L_{k,n}$ based in $P_k$. There is a cell $c_{j,n,a}$ at a position a inside $L_{j,n}$ and a cell $c_{k,n,b}$ at a position b inside $L_{k,n}$ corresponding to $c_{i,n}$. Considering the "height" of cell $c_{i,n}$ the length $l_{j,n,a}$ of cell $c_{j,n,a}$ and the "width" of cell $c_{i,n}$ the length $l_{k,n,b}$ of cell $c_{k,n,b}$:

$$a = \frac{d_{1,n}^2 + d_{2,n}^2}{l_{j,n,a}d_{2,n} - l_{k,n,b}d_{1,n}} \quad (19)$$

The bending vector r is obtained using equation (14):

$$r_i = \cos\left(\frac{d_{1,n}^2 + d_{2,n}^2}{l_{j,n,a}d_{2,n} - l_{k,n,b}d_{1,n}}\right),$$

$$r_j = -\frac{\sin\left(\frac{d_{1,n}^2 + d_{2,n}^2}{l_{j,n,a}d_{2,n} - l_{k,n,b}d_{1,n}}\right)}{\sqrt{d_{1,n}^2 + d_{2,n}^2}\, d_{1,n}}, \text{ and}$$

$$r_k = -\frac{\sin\left(\frac{d_{1,n}^2 + d_{2,n}^2}{l_{j,n,a}d_{2,n} - l_{k,n,b}d_{1,n}}\right)}{\sqrt{d_{1,n}^2 + d_{2,n}^2}\, d_{2,n}}$$

Distance from the reference plane to a cell is estimated as follows. The first order partial derivative $\partial d/\partial l$ at $c_{i,n}$ is obtained directly from the bending vector: $\partial d/\partial l = r_i$. The distance $p_{i,n}$ from the reference plane $P_i$ to the outer face of cell $c_{i,n}$ is estimated as:

$$p_{i,n} = p_i + \sum_{a=1}^{n} \cos\left(\frac{d_{1,a}^2 + d_{2,a}^2}{l_{j,a,o}d_{2,a} - l_{k,a,o}^p d_{1,a}}\right) l_{i,a,o} \quad (20)$$

where $l_{i,a}$ is the length of cell $c_{i,a}$.

3.5 Internal Stress

A cell is defined by its 3 local lengths, $l_x$, $l_y$, $l_z$, and its three bending vectors $r_x$, $r_y$, $r_z$ that change during the simulation. Consider that the three bending vectors are supposed to define locally an orthonormal basis in space. If three vectors $r_x$, $r_y$, $r_z$ define the orthonormal basis, then the dot products: $r_x \cdot r_y = r_x \cdot r_z = 0$.

Considering three crossing LEs: $L_x$ is based on plane $P_x$, $L_y$ is based on plane $P_y$, and $L_z$ is based on plane $P_z$. The crossing happens on cells $c_x$ in $L_x$, $c_y$ in $L_y$ and $c_z$ in $L_z$. The lengths of these cells are: $l_x$ for $c_x$, $l_y$ for $c_y$, and $l_z$ for $c_z$. The bending vectors $r=\{r_x^x, r_x^y, r_x^z\}$ for $c_x$, $r_y=\{r_y^x, r_y^y, r_y^z\}$ for $c_y$ and $r_z=\{r_z^x, r_z^y, r_z^z\}$ for $c_z$ are estimated. A vector of differences is defined as $d=d_i,d_j,d_k=\{r_x.r_y, r_x.r_z, r_y.r_{rz}\}$. A Jacobian matrix J is defined as:

$$J = \begin{vmatrix} \partial d_i/l_x & \partial d_i/l_y & \partial d_i/l_z \\ \partial d_j/l_x & \partial d_j/l_y & \partial d_j/l_z \\ \partial d_k/l_x & \partial d_k/l_y & \partial d_k/l_z \end{vmatrix}$$

Using the inverse $J^{-1}$ of the Jacobian matrix J, a vector of differences on the bending angles can be approximated: $c=J^{-1}*d=\{\Delta l_x, \Delta l_y, \Delta l_z\}$.

Using equation (1), the internal stress $s_i$ applied to cell $c_i$ can be defined as: $s_i=G_i*\Delta l_i/l_i$ where $G_i$ is the shear modulus of cell $c_i$. The total internal stress of a LE is thus the sum of the local stresses at each of its cells. The internal stress is represented in equation (12) as $P_{ortho}$.

The bend illustrated in FIG. 7 further demonstrates a coordinated deformation of the meshes. On the horizontal mesh, there is a displacement of the external elements causing the rotation of the LEs, while on the vertical mesh a compression of the inner LEs defined smaller cells with respect to the outer neighbors bending the cells. The cells closer to the extremity have a bend more accentuated in this case.

3.6 Approximating Partial Lengths

The meshing of the volume defines the initial dimensions of each cell. Physical modeling of the material defines the elasticity of each cell. At each time step during the simulation, a LE is submitted to external pressures from its contact with the environment, internal pressures of the liquid, internal pressures from the local stress at the cells level, superficial tension.

The static simulation estimates one difference in length for the whole LE. This difference needs to be decomposed in differences at each cell. To approximate this decomposition, it is assumed that only the local stress varies from one cell to another and that all other sources of deformation act uniformly over the LE.

The deformation on a LE composed by n cells caused by the local stress at the cells alone is defined as:

$$d = \sum_{i=1}^{n} s_i l_i / E_i \quad (21)$$

where $s_i$ is the local stress on cell i, $l_i$ is the cell's length at rest, and $E_i$ is the elasticity of the cell. For a total deformation $\Delta l$ of the LE, the length of cell i is estimated as:

$$\Delta l_i = l_i + s_i l_i / E_i + (\Delta l - d)/n \quad (22)$$

4. System Implementations and Applications

Figure 9:
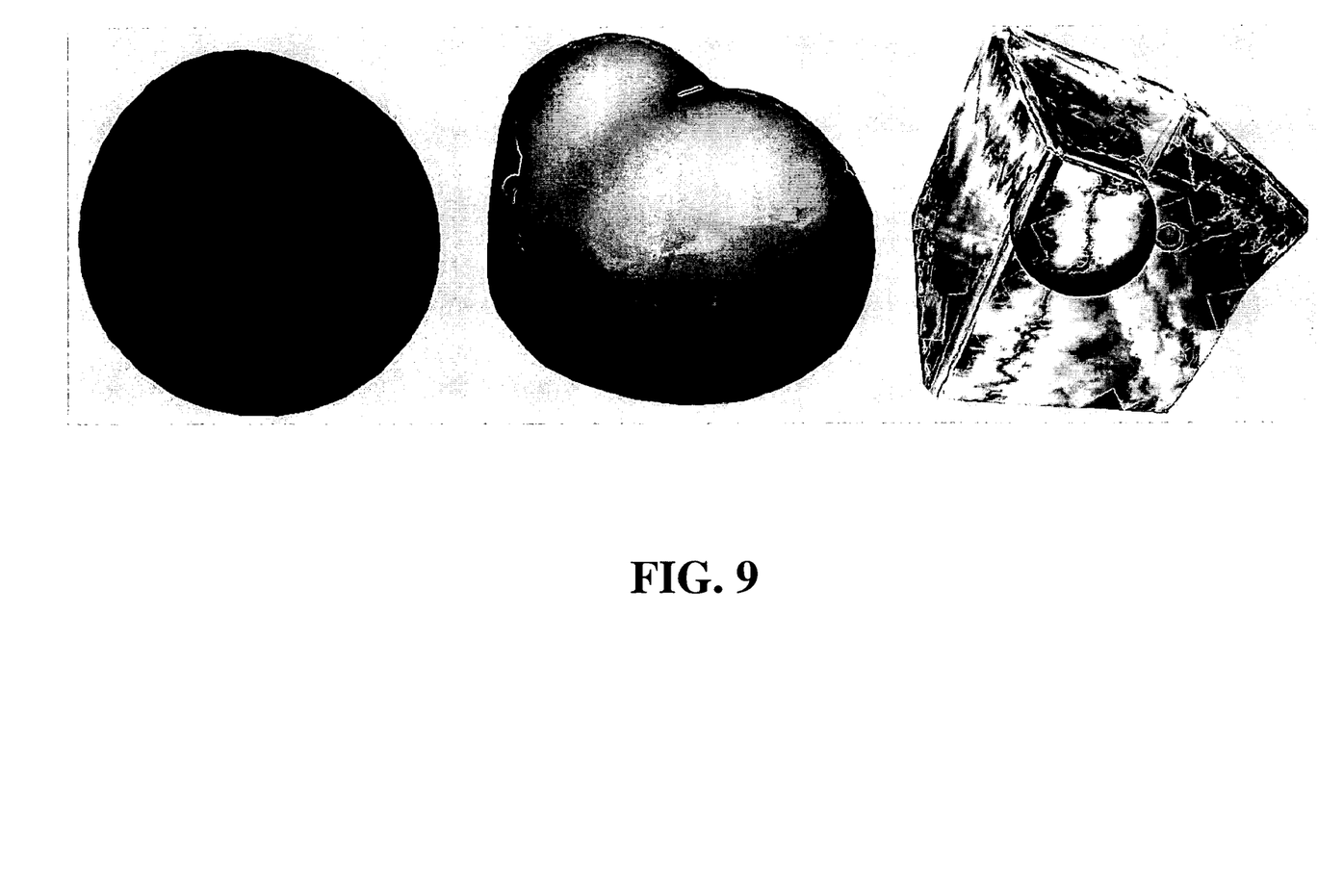
FIG. 9 shows exemplary LEM based deformation modeling.

In a standard dual 700 MHz PC, one iteration of the simulation loop takes about 0.05 seconds for a 600 elements mesh. FIG. 9 shows examples of deformations simulated using the inventive LEM disclosed herein.

In a system implemented with the teachings of the present invention, the global deformations are physically consistent and important phenomena such as the movement of all parts of the solid due to the preservation of volume are automatically produced.

As in any dynamic simulation methodology based on explicit integration of differential equations, it is necessary to balance time steps and damping accordingly to the scales and spring factors used on the model in order to acquire stability. The present invention minimizes the stability problems and enables the simulation of stiffer models by providing a novel LEM for simulating a system defined by fewer particles than a standard 3D method.

As will be understood by one of ordinary skill in the art, it is anticipated that the novel LEM may be implemented, updated and/or improved in various forms. For example, a formal analysis of the mapping between the LE space and 3D space can prove the correctness of the simulated geometry and physics. A study of the errors added by the first order approximations and linear elements is necessary to refine the LEM. A study of stability, ways to improve the LEM and its limits are also anticipated.

The present invention can be implemented as part of a more general VR simulator. The static solution aspect of the LEM solves the deformation problem in an elegant and simple way, independently of other simulation aspects as movements, i.e., translation, rotation, dynamics integration, etc., topology changes and collision handling. To obtain a generic simulator, the LEM can be integrated to methods suitable to handle these aspects.

For example, to facilitate modeling and collision detection, the LEM can be coupled to implicit or parametric surface methods. The deformations of the model are simulated in a set of LE meshes defining deformable two-dimensional (2D) sheets and rendered as a 3D volume through an implicit of parametric formulation of the object shape. The transformation from 2D sheets to 3D surfaces can be done using texture mapping techniques.

Of particular interest is the application of a surgical interface for performing virtual medical procedures. LEM based strategies, methodologies, and systems for meshing complex objects and algorithms for real time remeshing of objects to enable interactive topological changes (cutting, removing parts, suturing, etc.) are anticipated.

Furthermore, both elastic and plastic deformations can be simulated using the principles of the present invention. To simulate an elastic medium, the base lengths of the element $l_i$ are kept constant in equation (9) during the simulation. In a plastic deformation, the changes in length $\Delta l_i$ change permanently the element: $l_{i,n}=l_{i,n-1}+\Delta l_{i,n-1}$ where n indicates the time step of the simulation. Combinations of elastic and plastic deformations can be easily implemented as well. Note that for a plastic deformation, the system of static equations change, requiring a new matrix inversion. Using plastic deformation is also possible to mesh new objects. A "modeling clay" can be implemented mapping points from an meshed object, such as a cube, to a new one, such as a sphere. The differences in distance between the two sets of points are used to create external forces applied on the original object, molding it to fit the new shape.

In a system implemented with the inventive long elements, the 3D internal state inside a deforming medium can be modeled at any point from a reduced number of explicitly updated elements. The reduction in one order of magnitude of the number of elements enables the simulation of more complex objects with less computational effort. The combination of a state less and a dynamic approach improves the compliance of the simulation. Large deformations that rapidly change the entire shape of the object can be simulated in a reduced number of time steps. Much of the simulation occurs on the LE 1D space, where the complexity of all aspects of the simulation is strongly reduced. State-less deformations are estimated using only multiplications of matrices by vectors. The reduced number of elements further minimizes instability problems.

Although the present invention and its advantages have been described in detail, it should be understood that various changes, substitutions, and alternations could be made herein without departing from the principles and the scopes of the invention. Accordingly, the scope of the present invention should be determined by the following claims and their legal equivalents.

We claim:

1. Long Elements Method (LEM) for real time physically based modeling of a deformable medium, wherein said deformable medium represents soft tissue, comprising the steps of:
    constructing a plurality of long elements in a computer;
    configuring said computer with a meshing strategy based on said plurality of long elements wherein number of said plurality of long elements is proportional to $b^2$ where b is length of a side of said deformable medium thereby reducing number of time steps required by said modeling; and
    graphic and haptic rendering of said deformable medium using said meshing strategy.

2. The method of claim 1, wherein said deformable medium is an object filled with fluid.

3. The method of claim 1, further comprising a step of:
    simulating deformations and dynamics of said deformable medium.

4. The method of claim 3, wherein said deformations include elastic and plastic deformations and said dynamics include movement of said deformable medium.

5. The method of claim 1, further comprising a step of:
    simulating elastic deformations of said deformable medium, wherein said deformable medium is an object filled with fluid.

6. The method of claim 5, wherein said simulating is based on a set of static equations, volume conservation, and Pascal principle $\Delta P_i = \Delta P_j$ where P is pressure for any i and j.

7. The method of claim 6, wherein each of said static equations is an equilibrium equation defined for each of said plurality of long elements using material properties comprising pressure, volume, stress, strain, position, and velocity.

8. Long Elements Method (LEM) for real time physically based simulation of a deformable object, wherein said deformable medium represents soft tissue, comprising the steps of:
    discretising volume of said deformable object with a plurality of long elements wherein number of said plurality of long elements is proportional to $b^2$ where b is length of a side of said deformable object;
    providing a set of static equations wherein each of said static equations is defined for each of said plurality of long elements using dynamic variables;
    providing a static stateless deformation engine for simulating globally and physically consistent elastic deformations of said deformable object; and
    graphic and haptic rendering of said deformable medium using said set of static equations and said static stateless deformation engine.

9. The method of claim 8, wherein said deformation engine is based on said set of static equations, volume conservation, and Pascal principle.

10. The method of claim 8, wherein said dynamic variables represent quantities that vary significantly during said simulation, said dynamic variables comprising pressure, volume, stress, strain, position, and velocity.

11. Long Elements Method (LEM) for real time physically based dynamic simulation of a deformable medium, wherein said deformable medium represents soft tissue, comprising the steps of:
    generating a plurality of long elements wherein each of said plurality of long elements is an one-dimension entity;
    meshing said deformable medium based on said plurality of long elements wherein number of said plurality of long elements is proportional to $b^2$ where b is length of a side of said deformable medium;
    simulating said deformable medium in at least two different dimensional spaces simultaneously, wherein said at least two different dimensional spaces comprising lower order dimensions and higher order dimensions; and
    graphic and haptic rendering of said simulation of said deformable medium.

12. The method of claim 11, wherein said meshing step further comprises the steps of:
    projecting said deformable medium into a plurality of representations in lower order dimensions; and
    crossing said deformable medium with a plurality of reference planes of lower order dimensions, wherein points inside said deformable medium are simulated with respect to relative positions on said reference planes.

13. The method of claim 11, wherein said plurality of long elements comprise straight long elements and free form long elements.

14. The method of claim 11, wherein said at least two different dimensional spaces comprise a one-dimension long element space and a three-dimension Cartesian space.

* * * * *